(12) United States Patent
Peng et al.

(10) Patent No.: US 12,166,023 B2
(45) Date of Patent: Dec. 10, 2024

(54) LIGHT-EMITTING SUBSTRATE AND PREPARATION METHOD THEREOF, LIGHT-EMITTING MODULE, AND DISPLAY MODULE

(71) Applicant: BOE Technology Group Co., Ltd., Beijing (CN)

(72) Inventors: Weiting Peng, Beijing (CN); Xianqin Meng, Beijing (CN); Yishan Tian, Beijing (CN); Qiuyu Ling, Beijing (CN); Yujiao Guo, Beijing (CN); Wei Wang, Beijing (CN); Xiaochuan Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 446 days.

(21) Appl. No.: 17/603,011

(22) PCT Filed: Dec. 28, 2020

(86) PCT No.: PCT/CN2020/139874
§ 371 (c)(1),
(2) Date: Oct. 12, 2021

(87) PCT Pub. No.: WO2022/140886
PCT Pub. Date: Jul. 7, 2022

(65) Prior Publication Data
US 2023/0106169 A1   Apr. 6, 2023

(51) Int. Cl.
*H01L 25/16* (2023.01)
*H01L 27/12* (2006.01)
*H01L 33/60* (2010.01)

(52) U.S. Cl.
CPC .......... *H01L 25/167* (2013.01); *H01L 27/124* (2013.01); *H01L 33/60* (2013.01)

(58) Field of Classification Search
CPC ......... G02F 1/133603; G02F 1/133605; G02F 1/133611; G02F 1/133612; G02F 2203/03; H01L 25/167; H01L 25/0753
See application file for complete search history.

(56) References Cited

U.S. PATENT DOCUMENTS

| | | | |
|---|---|---|---|
| 2019/0265478 A1* | 8/2019 | Cok | G02B 27/0172 |
| 2020/0081298 A1* | 3/2020 | Liao | G02F 1/133603 |
| 2022/0373840 A1 | 11/2022 | Song et al. | |

FOREIGN PATENT DOCUMENTS

| | | |
|---|---|---|
| CN | 109270738 A | 1/2019 |
| CN | 109461376 A | 3/2019 |
| CN | 111781771 A | 10/2020 |
| JP | 2018-6259 A | 1/2018 |

* cited by examiner

*Primary Examiner* — Wasiul Haider
(74) *Attorney, Agent, or Firm* — Ling Wu; Stephen Yang; Ling and Yang Intellectual Property

(57) ABSTRACT

Provided are a light-emitting substrate and a preparation method thereof, a light-emitting module, and a display module. The light-emitting substrate includes a substrate, a drive circuit layer located on a side of the substrate, at least one light-emitting element located on a side of the drive circuit layer away from the substrate, and a first reflective layer disposed on a side of the light-emitting element away from the substrate; the drive circuit layer includes multiple first wirings and second wirings which are disposed crosswise, and the first wirings and the second wirings form at least one light transmittance region.

19 Claims, 5 Drawing Sheets

LIGHT-EMITTING SUBSTRATE AND PREPARATION METHOD THEREOF, LIGHT-EMITTING MODULE, AND DISPLAY MODULE

TECHNICAL FIELD

The present disclosure relates to, but is not limited to, the field of display technologies, in particular to a light-emitting substrate and a preparation method thereof, a light-emitting module, and a display module.

BACKGROUND

A back-light structure of a conventional display device includes a substrate, a drive circuit, a light-emitting element, an encapsulation layer of a light-emitting element, a light mixing film, a first diffusion sheet, a prism sheet, and a second diffusion sheet. Usually diffusion sheets are used to homogenize light in order to achieve uniformity of light emission. The diffusion sheets make an overall thickness of a back-light structure relatively increase, which affects the overall light extraction efficiency. Conventional light-emitting elements are based on upward light emission, and a coverage area of a single lamp is limited, it is needed to increase the number of light-emitting elements to ensure light coverage of a light-emitting surface, which leads to a significant increase in back-light cost of a large-size display device, and affects control of a volume and a cost of an entire display device. A Mini-LED is used in a back-light design, because of high operability of each chip and high fineness of coverage area, operations such as regional lighting may be achieved and controllability of a back-light module may be improved. However, a size of a Mini-LED chip is small, so that a larger quantity of chips is needed in practical application, and more film structures and certain observation distance conditions are required to obtain a high uniformity effect of a light-emitting surface. This limits miniaturization of a Mini-LED as a back-light structure in an application design, and brings about a problem of a high cost.

SUMMARY

The following is a summary of subject matter described in detail herein. This summary is not intended to limit the protection scope of claims.

A light-emitting substrate including a substrate, a drive circuit layer located on a side of the substrate, at least one light-emitting element located on a side of the drive circuit layer away from the substrate, and a first reflective layer disposed on a side of the light-emitting element away from the substrate; the drive circuit layer includes multiple first wirings and second wirings which are disposed crosswise, and the first wirings and the second wirings form at least one light transmittance region.

In an exemplary embodiment, the first wirings extend along a first direction, and the second wirings extend along a second direction, and the first direction is different from the second direction.

In an exemplary embodiment, the drive circuit layer further includes a second reflective layer disposed on a side of the first wirings close to the substrate, and a vertical projection of the second reflective layer on the substrate is at least partially overlapped with a vertical projection of the first wirings on the substrate.

In an exemplary embodiment, the drive circuit layer further includes a third reflective layer disposed on a side of the second wirings away from the substrate, and a vertical projection of the third reflective layer on the substrate is at least partially overlapped with a vertical projection of the second wirings on the substrate.

In an exemplary embodiment, a light-emitting region is provided corresponding to a light-emitting element on a side of the drive circuit layer close to the substrate, and the light-emitting region includes a first light-emitting sub-region and a second light-emitting sub-region; the first reflective layer reflects at least part of light emitted by the light-emitting element to the first light-emitting sub-region; and the first reflective layer reflects light reflected by the drive circuit layer to the second light-emitting sub-region.

In an exemplary embodiment, the light-emitting element is in one-to-one correspondence to the light-emitting region.

In an exemplary embodiment, the second light-emitting sub-region is disposed around the first light-emitting sub-region; the light-emitting region further includes a third light-emitting sub-region, which is located on a side of the second light-emitting sub-region away from the first light-emitting sub-region and is disposed around the second light-emitting sub-region; and the first reflective layer reflects at least part of light reflected by the drive circuit layer to the third light-emitting sub-region.

In an exemplary embodiment, at least two light-emitting elements are provided on the light-emitting substrate, and the at least two light-emitting elements include first light-emitting element and second light-emitting element adjacent to each other, and a third light-emitting sub-region of the first light-emitting element is at least partially overlapped with a third light-emitting sub-region of the second light-emitting element.

In an exemplary embodiment, the first light-emitting sub-region is circular, and both the second light-emitting sub-region and the third light-emitting sub-region are annular; or, the first light-emitting sub-region is rectangular, and both the second light-emitting sub-region and the third light-emitting sub-region are rectangular rings.

In an exemplary embodiment, the first light-emitting sub-region is circular, and both the second light-emitting sub-region and the third light-emitting sub-region are annular; radii $R_n$ of the first light-emitting sub-region, the second light-emitting sub-region, and the third light-emitting sub-region satisfy the following formula.

$$R_n = 0.5l + (2n-1)t \times \tan\theta$$

t is a distance between the drive circuit layer and the first reflective layer, in mm; l is a side length of the light-emitting element, in mm; n is a partition level of a light-emitting sub-region of a side of the drive circuit layer near the substrate; and θ is a total reflective angle of light on a side of the drive circuit layer away from the substrate.

In an exemplary embodiment, a distance L between adjacent light-emitting elements satisfies the following formula.

$$L = l + 2 \times 2(N-1)t \times \tan\theta$$

t is a distance between the drive circuit layer and the first reflective layer, in mm; l is a side length of the light-emitting element, in mm; N is a partition quantity of a light-emitting sub-region of a side of the drive circuit layer near the substrate; and θ is a total reflective angle of light on a side of the drive circuit layer away from the substrate.

In an exemplary embodiment, one side of the drive circuit layer close to the substrate includes a light-emitting region corresponding to the light-emitting element, the light-emitting region is divided into N light-emitting sub-regions, and the N light-emitting sub-regions at least includes a first light-emitting sub-region and a second light-emitting sub-region; the first reflective layer reflects light emitted by the light-emitting element to the first light-emitting sub-region; the first reflective layer reflects light reflected by the wirings to the second light-emitting sub-region, and a light transmittance rate $T_n$ of each light-emitting sub-region satisfies the following formula.

$$T_n = \frac{2}{2 \times (N-n) + 1}$$

N is a partition quantity of light-emitting sub-regions in one side of the drive circuit layer close to the substrate; and n is a partition level of a light-emitting sub-region of a side of the drive circuit layer close to the substrate.

In an exemplary embodiment, a line width of the wirings is less than 100 um.

In an exemplary embodiment, a surface of the first reflective layer near the light-emitting element is provided with multiple micro-structures, and/or the first reflective layer includes multiple blowhole structures.

In an exemplary embodiment, an encapsulation layer located between the light-emitting element and the first reflective layer is further included, wherein a refractive index of the encapsulation layer is less than or equal to a refractive index of the substrate.

In an exemplary embodiment, a distance from a surface of the encapsulation layer away from the substrate to the substrate is greater than a distance from a surface of the light-emitting element away from the substrate to the substrate; and/or a flatness of a surface of the encapsulation layer away from the light-emitting element is greater than 95%.

In an exemplary embodiment, the light-emitting element is a Mini-LED.

A light-emitting module including the aforementioned light-emitting substrate, and at least one of a Quantum Dots layer, a prism sheet, and a Curtain Tape disposed on a light-emitting side of the light-emitting substrate.

A display module, including the aforementioned light-emitting module.

A preparation method of a light-emitting substrate, including: forming a drive circuit layer on a side of a substrate; forming at least one light-emitting element on a side of the drive circuit layer away from the substrate; and forming a first reflective layer on a side of the light-emitting element away from the substrate; wherein the drive circuit layer includes a plurality of first wirings and second wirings which are disposed crosswise, and the first wirings and the second wirings form at least one light transmittance region.

Other aspects will become apparent upon reading and understanding accompanying drawings and the detailed description.

BRIEF DESCRIPTION OF DRAWINGS

The attached drawings are for providing a further understanding for technical schemes of the present disclosure and constitute a part of the description. They are for explaining the technical schemes of the present disclosure together with the embodiments of the present disclosure and do not constitute a limitation on the technical schemes of the present disclosure. Shapes and sizes of various components in the drawings do not reflect true scales and are only intended to illustrate contents of the present disclosure schematically.

DETAILED DESCRIPTION

Figure 1:
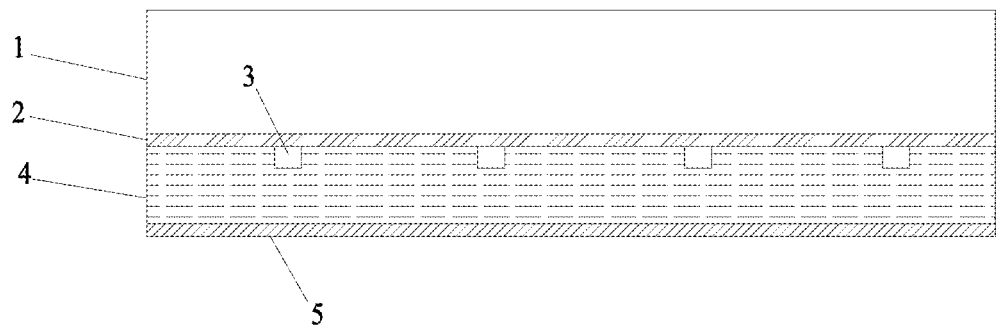
FIG. 1 is a sectional view of a light-emitting substrate of an exemplary embodiment of the present disclosure.

The embodiments herein may be implemented in multiple different ways. A person of ordinary skills in the art may readily understand a fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of a constituent element, a thickness of a layer or an area of the layer may be sometimes exaggerated for clarity. Therefore, any implementation mode of the present disclosure is not necessarily limited to sizes shown in the drawings, and the shapes and sizes of the components in the drawings do not reflect true proportions. In addition, the drawings schematically show ideal examples, and any implementation mode of the present disclosure is not limited to the shapes or values shown in the drawings.

In the present disclosure, ordinal numbers such as "first", "second", and "third" are set to avoid confusion of constituent elements, rather than to limit in quantity.

In the present disclosure, for sake of convenience, wordings indicating orientations or positional relationships such as "central", "upper", "lower", "front", "rear", "vertical", "horizontal", "top", "bottom", "inner", "outer" are used to describe positional relationships of constituent elements with reference to the drawings, which are only for convenience of describing the embodiments and simplifying the description, rather than indicating or implying that the apparatus or element referred to must have a specific orientation, or must be constructed and operated in a specific orientation, and therefore cannot be construed as limitations on the present disclosure. The positional relationships of the constituent elements may be appropriately changed according to a direction in which each constituent element is described. Therefore, it is not limited to the wordings described in the present disclosure, and may be changed appropriately according to a situation.

In the present disclosure, the terms "installed", "connected", and "coupled" shall be broadly understood unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand meanings of the above terms in the present disclosure according to a situation.

In the present disclosure, a transistor refers to an element that includes at least three terminals: a gate electrode, a drain electrode, and a source electrode. The transistor has a channel region between the drain electrode (or referred to as a drain electrode terminal, a drain region, or a drain electrode) and the source electrode (or referred to as a source electrode terminal, a source region, or a source electrode), and a current may flow through the drain electrode, the channel region, and the source electrode. In the present disclosure, the channel region refers to a region through which a current mainly flows.

In the present disclosure, the first electrode may be a drain electrode and the second electrode may be a source electrode, or the first electrode may be a source electrode and the second electrode may be a drain electrode. In a case that transistors with opposite polarities are used or in a case that a direction of a current is changed in an operation of a circuit, a function of a "source electrode" and a function of a "drain electrode" may sometimes be interchangeable. Therefore, a "source electrode" and a "drain electrode" may be interchangeable in the present disclosure.

In the present disclosure, an "electrical connection" includes a case where constituent elements are connected via an element having a certain electrical function. The "element with a certain electrical function" is not particularly limited as long as electrical signals may be transmitted and received between connected constituent elements. An "element with a certain electrical function" may be, for example, an electrode or a wiring, a switching element such as a transistor, or other functional elements such as a resistor, an inductor, or a capacitor.

In the present disclosure, "parallel" refers to a state in which an angle formed by two straight lines is-10 degrees or more and 10 degrees or less, and thus also includes a state in which the angle is-5 degrees or more and 5 degrees or less. In addition, "vertical" refers to a state in which an angle formed by two straight lines is 80 degrees or more and 100 degrees or less, and thus also includes a state in which the angle is 85 degrees or more and 95 degrees or less.

In the present disclosure, a "film" and a "layer" are interchangeable. For example, sometimes a "conductive layer" may be replaced by a "conductive film". Similarly, an "insulating film" may sometimes be replaced by an "insulating layer".

The wording "about" in the present disclosure means that a limit is not strictly limited, and a value within a range of process and measurement errors is allowed.

An exemplary embodiment of the present disclosure provides a light-emitting substrate, including a substrate, a drive circuit layer located on a side of the substrate, at least one light-emitting element located on a side of the drive circuit layer away from the substrate, and a first reflective layer disposed on a side of the light-emitting element away from the substrate; the drive circuit layer includes multiple first wirings and second wirings which are disposed crosswise, and the first wirings and the second wirings form at least one light transmittance region. The light-emitting element may emit light toward the first reflective layer, and the first reflective layer may reflect incident light toward a direction of the drive circuit layer. Part of light incident toward the drive circuit layer may be emitted through the light transmittance region, and part of the light incident toward the drive circuit layer is reflected by the first wiring and the second wiring toward the first reflective layer.

Figure 2:
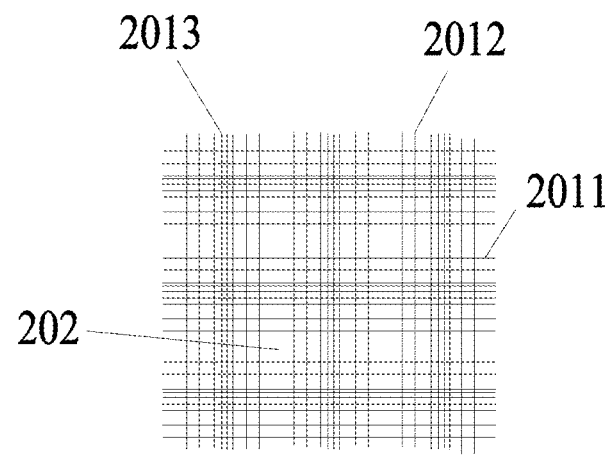
FIG. 2 is a schematic diagram of a structure of a drive circuit layer in an exemplary embodiment of the present disclosure.

FIG. 1 is a sectional view of a light-emitting substrate of an exemplary embodiment of the present disclosure, and FIG. 2 is a schematic diagram of a structure of a drive circuit layer in an exemplary embodiment of the present disclosure. As shown in FIG. 1 and FIG. 2, the light-emitting substrate includes a substrate 1, a drive circuit layer 2 located on a side of the substrate 1, at least one light-emitting element 3 located on a side of the drive circuit layer 2 away from the substrate 1, and a first reflective layer 5 disposed on a side of the light-emitting element 3 away from the substrate 1; and the drive circuit layer 2 includes multiple first wirings 2011 and second wirings 2012 disposed crosswise, wherein the first wirings 2011 and the second wirings 2012 form at least one light transmittance region 202. The light-emitting element 3 may emit light toward a direction of the first reflective layer 5. The first reflective layer 5 can reflect incident light toward a direction of the drive circuit layer 2, that is, the first reflective layer 5 can reflect light emitted from the light-emitting element 3 into the first reflective layer 5 to the drive circuit layer 2. Part of light incident toward the drive circuit layer 2 may pass through the light transmittance region 202 and exit through the substrate 1. Part of light incident toward the drive circuit layer 2 is reflected by the first wirings 2011 and the second wirings 2012 toward the first reflective layer 5, and then reflected to the drive circuit layer 2 through the first reflective layer 5, so that the light emitted by the light-emitting element 3 can be transmitted repeatedly by oscillation between the drive circuit layer 2 and the first reflective layer 5, and an optical path is increased by multiple orders, thus achieving a better uniform light effect, increasing a distance between light-emitting elements 3, reducing the number of the light-emitting elements 3 and reduce costs.

In an exemplary embodiment, the first wirings 2011 extend along a first direction and the second wirings 2012 extend along a second direction, the second direction is different from the first direction. By setting wiring densities of the first wirings 2011 at different positions in the second direction and setting wiring densities of the second wirings 2012 at different positions in the first direction, a proportion of light transmittance regions 202 in different regions of the drive circuit layer 2 may be controlled, and then a transmittance-reflection ratio of the drive circuit layer 2 may be adjusted, thereby light-emitting energy transmitted through the drive circuit layer 2 is redistributed, while improving a uniformity of a light-emitting surface of the light-emitting substrate, utilization of light energy of the light-emitting element 3 is increased, and a light efficiency is improved, so that use of a diffusion sheet in the light-emitting substrate is omitted, a thickness of the light-emitting substrate is reduced, a structure is light and thin, and may be applied to a design solution of a display device with large-size and low-thickness such as a TV display.

There is no need to add a light mixing film in the light-emitting substrate in the embodiment of the present invention, or provide an Optical Distance for back-light uniform light, thereby reducing a thickness of the light-emitting substrate, at the same time light-emitting uniformity of the light-emitting substrate can reach 80% or more.

In an exemplary embodiment, the drive circuit layer 2 further includes a third wiring 2013, which is connected with a light-emitting element to drive the light-emitting element to emit light.

Figure 3:
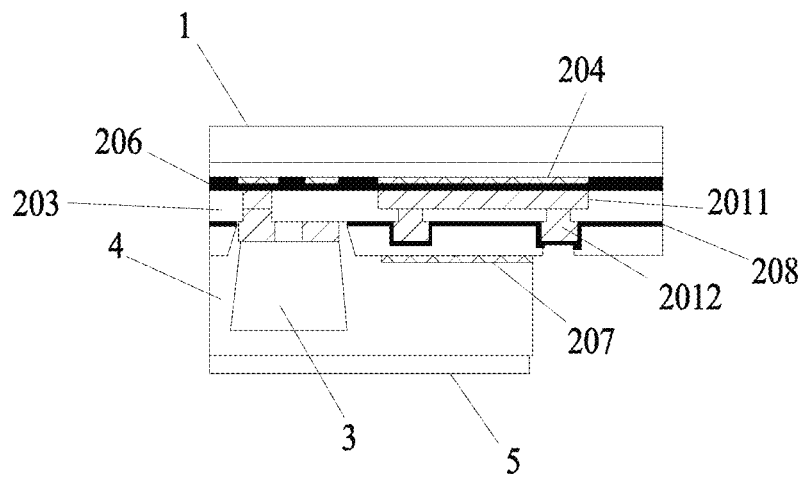
FIG. 3 is a sectional view of a drive circuit layer in an exemplary embodiment of the present disclosure.

FIG. 3 is a sectional view of a drive circuit layer in an exemplary embodiment of the present disclosure. As shown in FIGS. 2 and 3, along a thickness direction of a substrate 1, a drive circuit layer 2 includes a first wiring 2011 and a second wiring 2012 that are stacked, and a first insulating layer 203 disposed between the first wiring 2011 and the second wiring 2012.

In an exemplary embodiment, along the thickness direction of the substrate 1, the drive circuit layer 2 further includes a second reflective layer 204 disposed on a side of the first wiring 2011 near the substrate 1, and a vertical projection of the second reflective layer 204 on the substrate 1 at least partially overlaps with a vertical projection of the first wiring 2011 on the substrate 1. Further, the vertical projection of the first wiring 2011 on the substrate 1 is located in the vertical projection of the second reflective layer 204 on the substrate 1. The second reflective layer 204 is used to reduce an absorption loss of light by the first wiring 2011.

In an exemplary embodiment, the vertical projection of the second reflective layer 204 on the substrate 1 at least partially overlaps with vertical projections of the first wiring 2011 and the second wiring 2012 on the substrate 1. Further, the vertical projections of the first wiring 2011 and the second wiring 2012 on the substrate 1 are located in the vertical projection of the second reflective layer 204 on the substrate 1. The second reflective layer 204 can reduce an absorption loss of light by the first wiring 2011 and the second wiring 2012.

In an exemplary embodiment, along the thickness direction of the substrate 1, the drive circuit layer further includes a second insulating layer 206 disposed between the second reflective layer 204 and the first wiring 2011.

In an exemplary embodiment, along the thickness direction of the substrate 1, the drive circuit layer 2 further includes a third reflective layer 207 disposed on a side of the second wiring 2012 away from the substrate 1, and a vertical projection of the third reflective layer 207 on the substrate 1 at least partially overlaps with a vertical projection of the second wiring 2012 on the substrate 1. Further, the vertical projection of the second wiring 2012 on the substrate 1 is located in the vertical projection of the third reflective layer 207 on the substrate 1. The third reflective layer 207 is used to reduce an absorption loss of light by the second wiring 2012.

In an exemplary embodiment, the vertical projection of the third reflective layer 207 on the substrate 1 at least partially overlaps with vertical projections of the first wiring 2011 and the second wiring 2012 on the substrate 1. Further, the vertical projections of the first wiring 2011 and the second wiring 2012 on the substrate 1 are located in the vertical projection of the third reflective layer 207 on the substrate 1. The third reflective layer 207 can reduce an absorption loss of light by the first wiring 2011 and the second wiring 2012.

In an exemplary embodiment, along the thickness direction of the substrate 1, the drive circuit layer 2 further includes a third insulating layer 208 disposed between the third reflective layer 207 and the second wiring 2012.

In an exemplary embodiment, the second reflective layer 204 and the third reflective layer 207 are made of a reflective material. For example, the second reflective layer 204 and the third reflective layer 207 are made of a laminated material of ITO/Ag/ITO, or the second reflective layer 204 and the third reflective layer 207 are made of white photoresist.

In an exemplary embodiment, the drive circuit layer 2 further includes a planarization layer disposed on a side of the third insulating layer 208 away from the second wiring 2012, and the third reflective layer 207 is disposed on the planarization layer away from the third insulating layer 208.

In an exemplary embodiment, the light-emitting substrate further includes an encapsulation layer 4 located between the light-emitting element 3 and the first reflective layer 5, and the encapsulation layer 4 covers the light-emitting element 3.

Figure 4:
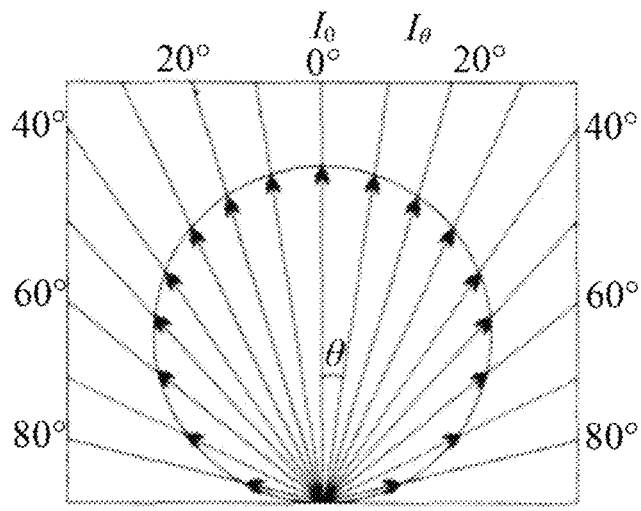
FIG. 4 is a schematic diagram of an angular spectrum and a light intensity distribution of a light-emitting element in an exemplary embodiment of the present disclosure.

FIG. 4 is a schematic diagram of an angular spectrum and a light intensity distribution of a light-emitting element in an exemplary embodiment of the present disclosure. As shown in FIG. 4, a light-emitting element according to the embodiment of the present invention is a Lambertian light-emitting element, and an energy distribution of the Lambertian light-emitting element needs to satisfy the following formula.

$$I = I_o \cos \theta$$

Since a light-emitting element is encapsulated in an encapsulation layer, for a luminous condition of the Lambertian light-emitting element, only light energy within a radiation angle range of +40 degrees to −40 degrees can be emitted through the encapsulation layer, and light beyond +40 degrees to −40 degrees is limited in the encapsulation layer due to total reflection. At the same time, light within the radiation angle range of +40 degrees to −40 degrees concentrates about 61% of the light energy of the light-emitting element. A distribution design of a transmittance-reflection ratio is carried out through wirings in a drive circuit layer, light energy passing through the drive circuit layer is redistributed, light that is directly transmitted through the drive circuit layer once after being reflected by a reflective layer is reduced, and energy of light reflected by the drive circuit layer is increased and enters into a next transmission process, thereby realizing a distribution design of light energy of the drive circuit layer and realizing a uniform light-emitting effect.

Figure 5:
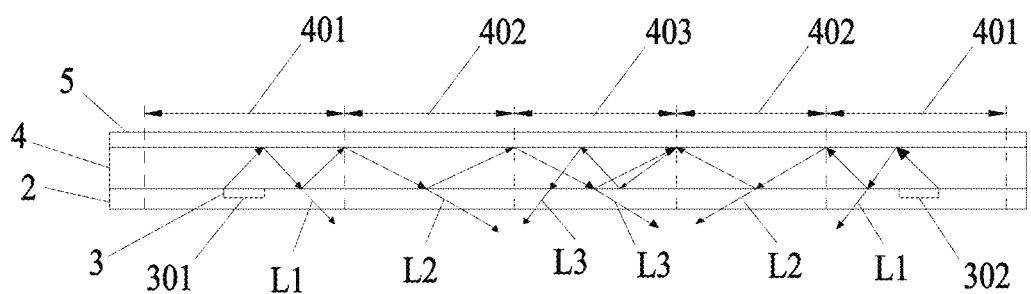
FIG. 5 is a schematic diagram of a light path between a drive circuit layer and a first reflective layer in an exemplary embodiment of the present disclosure.

FIG. 5 is a schematic diagram of a light path between a drive circuit layer and a first reflective layer in an exemplary embodiment of the present disclosure. As shown in FIG. 5, a light-emitting region is provided corresponding to a light-emitting element 3 on a side of a drive circuit layer 2 near a substrate 1, and the light-emitting region includes a first light-emitting sub-region 401 and a second light-emitting sub-region 402; a first reflective layer reflects at least part of light emitted by a light-emitting element to the first light-emitting sub-region 401; among light incident to the first light-emitting sub-region 401, a part of the light exits through the first light-emitting sub-region 401 to form a first exit light L1, and a part of the light is reflected back to the first reflective layer by wirings in the drive circuit layer 2.

The first reflective layer reflects the light reflected by the drive circuit layer 2 again to the second light-emitting sub-region 402, and among light incident to the second light-emitting sub-region 402, a part of the light exits through the second light-emitting sub-region 402 to form a second exit light L2, and a part of the light is reflected back to the first reflective layer by the wirings in the drive circuit layer 2.

As shown in FIG. 5, the second light-emitting sub-region 420 is disposed around the first light-emitting sub-region 401; the light-emitting region further includes a third light-emitting sub-region 403, which is located on a side of the second light-emitting sub-region 402 away from the first light-emitting sub-region 401 and is disposed around the second light-emitting sub-region 420; and the first reflective layer 5 reflects at least part of light reflected by the drive circuit layer 2 to the third light-emitting sub-region 403. At least two light-emitting elements 3 are provided on the light-emitting substrate, and the at least two light-emitting elements 3 include adjacent first light-emitting element 301 and second light-emitting element 302, and a third light-emitting sub-region 403 of the first light-emitting element 301 at least partially overlaps with a third light-emitting sub-region 403 of the second light-emitting element 302.

Figure 6:
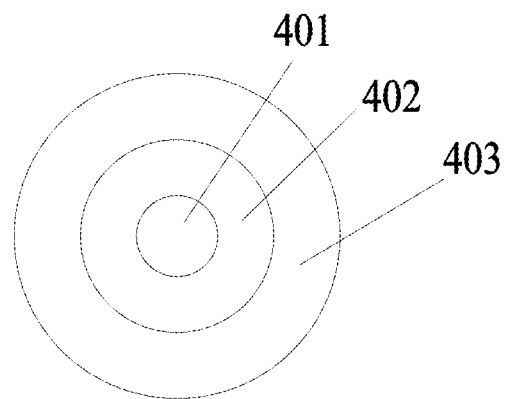
FIG. 6 is a first schematic diagram of a side of a drive circuit layer near a substrate in an exemplary embodiment of the present disclosure.
Figure 7:
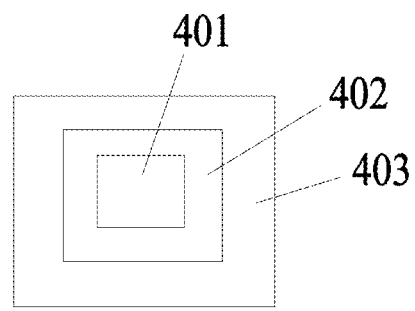
FIG. 7 is a second schematic diagram of a side of a drive circuit layer near a substrate in an exemplary embodiment of the present disclosure.

FIG. 6 is a first schematic diagram of a side of a drive circuit layer near a substrate in an exemplary embodiment of the present disclosure, and FIG. 7 is a second schematic diagram of a side of a drive circuit layer near a substrate in an exemplary embodiment of the present disclosure. In the embodiment of the present invention, the first light-emitting sub-region 401, the second light-emitting sub-region 402, and the third light-emitting sub-region 403 may adopt various shapes. For example, the first light-emitting sub-region 401 is circular, and both the second light-emitting sub-region 402 and the third light-emitting sub-region 403 are annular, as shown in FIG. 6. Or, the first light-emitting sub-region 401 is rectangular, and both the second light-emitting sub-region 402 and the third light-emitting sub-region 403 are rectangular rings, as shown in FIG. 7.

In an exemplary embodiment, light-emitting elements are in one-to-one correspondence to light-emitting regions. A light-emitting region is divided into N light-emitting sub-regions, and the N light-emitting sub-regions at least include a first light-emitting sub-region and a second light-emitting sub-region. A light transmittance rate $T_n$ of each light-emitting sub-region satisfies the following formula.

$$T_n = \frac{2}{2 \times (N-n) + 1}$$

N is a partition number of light-emitting sub-regions in one side of the drive circuit layer near the substrate; and n is a partition level of a light-emitting sub-region in one side of the drive circuit layer near the substrate. In the embodiment of the present invention, a light transmittance rate of a light-emitting sub-region farthest from the first light-emitting sub-region is 100%.

For example, the light-emitting region is divided into three light-emitting sub-regions, including a first light-emitting sub-region, a second light-emitting sub-region, and a third light-emitting sub-region. According to the above formula, light transmittance rates of the first, second, and third light-emitting sub-regions should be 40.0%, 66.7%, and 100%, respectively.

Or, the light-emitting region is divided into five light-emitting sub-regions, including a first light-emitting sub-region, a second light-emitting sub-region, a third light-emitting sub-region, a fourth light-emitting sub-region, and a fifth light-emitting sub-region. The fourth light-emitting sub-region and the fifth light-emitting sub-region may be regions where a first reflective layer reflects and emits light emitted by a light-emitting element, or regions where a first reflective layer reflects and emits light reflected by a first wiring and a second wiring, or overlapping regions where a first reflective layer partially reflects and emits light emitted by adjacent light-emitting elements. According to the above formula, light transmittance rates of the first, second, third, fourth, and fifth light-emitting sub-regions should be 22.3%, 28.6%, 40.0%, 66.7% and 100%, respectively.

In order to achieve the highest utilization rate of light energy, it is necessary to divide light energy passing through a drive circuit layer equally into each light-emitting sub-region. Therefore, a partition number N of light-emitting sub-regions is related to light effect finally transmitted through the drive circuit layer. The more partition number N of the light-emitting sub-regions, the lower the energy allocated to each light-emitting sub-region.

In addition, an energy distribution design of each part may be performed through other calculation rules, and the uniform light effect may also be obtained. For example, the whole energy may be set as 25% of central energy for an energy distribution design. However, an energy distribution needs to consider back-light brightness requirements. Increasing a partition may increase a pitch of light-emitting elements, but it will reduce an amount of light emitted by the entire light-emitting elements, thereby increasing energy consumption. Therefore, it is necessary to weigh a relationship between power consumption of back-light and costs of light-emitting elements when designing a partition number of light-emitting sub-regions.

In an exemplary embodiment, in the embodiment of the present invention, according to a refractive index of an encapsulation layer and a distance parameter between a drive circuit layer and a first reflective layer, a radius value or a side length value of each light-emitting sub-region is calculated to determine a coverage range of a distribution region of each light-emitting sub-region.

Taking an example where a light-emitting region is divided into three light-emitting sub-regions, including a first light-emitting sub-region, a second light-emitting sub-region, and a third light-emitting sub-region, wherein the first light-emitting sub-region is circular, and both the second light-emitting sub-region and the third light-emitting sub-region are annular, a radius $R_n$ of the first light-emitting sub-region, the second light-emitting sub-region, and the third light-emitting sub-region satisfies the following formula.

$$R_n = 0.5l + (2n-1)t \times \tan\theta$$

t is a distance between a drive circuit layer and a first reflective layer, in mm; n is a partition level of a light-emitting sub-region on a side of the drive circuit layer near a substrate; $\theta$ is a total reflective angle of light on a side of the drive circuit layer away from the substrate, and l is a side length of a light-emitting element, in mm;

In an exemplary embodiment, a third light-emitting sub-region is an overlapping region where a first reflective layer partially reflects and emits light emitted by adjacent light-emitting elements. A pitch L between adjacent light-emitting elements is: $L = l + 2 \times 2(N-1)t \times \tan\theta$, t is a distance from a drive circuit layer to the first reflective layer, in mm; l is a side length of a light-emitting element, in mm; N is a partition number of light-emitting sub-regions of a side of the drive circuit layer near a substrate; n is a partition level of a light-emitting sub-region of a side of the drive circuit layer near the substrate; and θ is a total reflective angle of light on a side of the drive circuit layer away from the substrate.

According to the above formula, radii R1, R2, and R3 of the first, second, and third light-emitting sub-regions are 0.572 mm, 1.094 mm, and 1.616 mm, respectively. A pitch L between adjacent light-emitting elements is 2.71 mm.

In an exemplary embodiment, taking a light-emitting region divided into five light-emitting sub-regions as an example, according to the above formula, radii of the five light-emitting sub-regions are 0.572 mm, 1.094 mm, 1.616 mm, 2.138 mm, and 2.66 mm, respectively. A pitch L between adjacent light-emitting elements is 7.924 mm.

In an exemplary embodiment, taking a light-emitting substrate designed with a 65-inch 4K display screen as an example, in the embodiment of the present invention, a pitch between light-emitting elements is 5.595 mm*5.595 mm, and a display region is 1430 mm*840 mm. 38,000 Mini-LEDs may be used to achieve a light-emitting substrate with an Optical Distance (OD) of 0 mm, of which back-light uniformity is greater than 90% and a light efficiency is greater than 80%.

The embodiment of the present invention adopts a scheme of emitting light in a direction away from a substrate by a light-emitting element and utilizing a design of wirings in a drive circuit layer to realize adjustment and control of a light transmittance rate of the drive circuit layer, and obtain uniform light-emitting effect on a light-emitting side of a light-emitting substrate. In addition, by using the scheme of emitting light in the direction away from the substrate by the light-emitting element, an encapsulation layer and the substrate may be used at the same time to increase an optical path, and increase a pitch between light-emitting elements and reduce the number of light-emitting elements used while reducing a thickness of the entire light-emitting substrate. For example, taking a 65-inch TV as an example, compared with a conventional 65-inch TV, a pitch between light-emitting elements in the embodiment of the present invention is increased from 7.5 mm to about 8 mm, and the overall thickness of a light-emitting substrate is reduced.

In an exemplary embodiment, pitches between adjacent light-emitting elements in the embodiment of the present invention are the same, and a light-emitting region includes a third light-emitting sub-region. Due to use of the third light-emitting sub-region of an overlapping design of light-emitting regions of light-emitting elements, light transmitted many times in an encapsulation layer are superimposed to maintain higher far-end brightness in a case of increasing a distance between adjacent light-emitting elements, thereby ensuring light-emitting uniformity of the entire light-emitting substrate. The embodiment of the present invention may greatly reduce the number of light-emitting elements required by the entire light-emitting substrate. Under a scheme of improving uniformity, when a partition number is increased to 8, a pitch between light-emitting elements may reach 5.595 mm. At this time, compared with a conventional 65-inch TV display, a pitch between light-emitting elements is increased from 7.5 mm to nearly 8 mm, and a diffusion plate structure in a light-emitting substrate is omitted, so that an overall thickness of the light-emitting substrate is reduced from 6 mm to 2 mm, and a cost is reduced to a certain extent.

Figure 8:
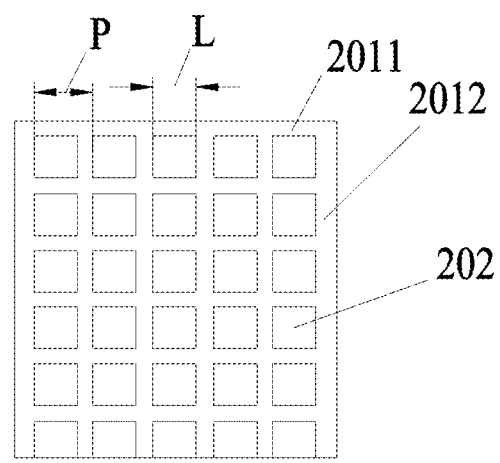
FIG. 8 is a schematic diagram of distributions of a first wiring and a second wiring in an exemplary embodiment of the present disclosure.

FIG. 8 is a schematic diagram of distributions of a first wiring and a second wiring in an exemplary embodiment of the present disclosure. By setting wiring densities of the first wiring 2011 extending along a first direction at different positions in a second direction and setting wiring densities of the second wiring 2012 extending along the second direction at different positions in the first direction, a proportion of a light transmittance region can be achieved. As shown in FIG. 8, taking the light transmittance region 202 as a rectangle as an example. A proportion T of the light transmittance region 202 satisfies the following formula.

$$T = \frac{L^2}{P^2}$$

L is a side length of the light transmittance region 202, and the unit is um; P is a sum of a side length of the light transmittance region 202 and a pitch between adjacent light transmittance regions 202 and the unit is um.

When P=10 um, the side length of the light transmittance region 202 L=6.32 um, and the proportion T of the light transmittance region 202 is 40%, that is, at this time, a transmittance-reflection ratio of a drive circuit layer is: 40% of light is transmitted and 60% of light is reflected. At the same time, a tolerance of a structure is +10%, which has a high tolerance for a structural error. Corresponding to a wiring design, when a proportion of the light transmittance region 202 in a wiring of a high reflectivity LED drive circuit reaches 40%, it may be equivalent to a transmittance-reflection design with a transmittance rate of 40% and a reflectivity of 60%.

Figure 10:
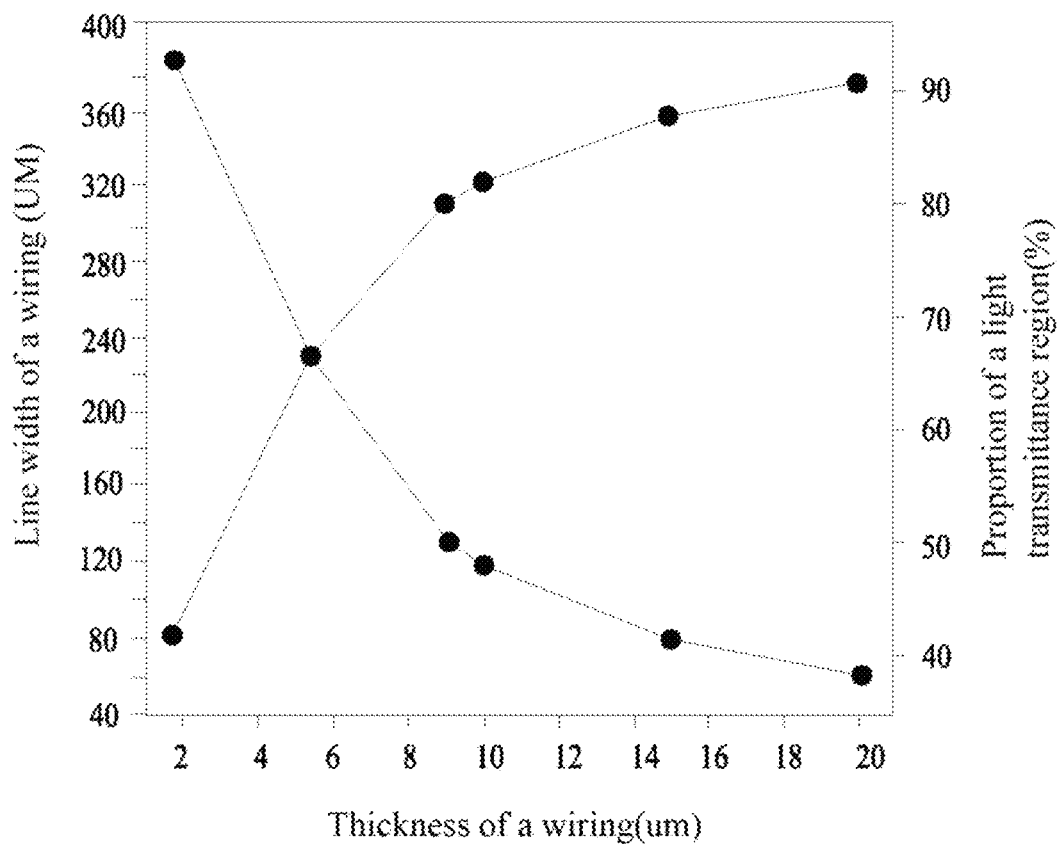
FIG. 10 is a graph of a relationship among a line width of a wiring, a thickness, and a light transmittance region in an exemplary embodiment of the present disclosure.

FIG. 10 is a graph of a relationship among a line width of a wiring, a thickness, and a light transmittance region in an exemplary embodiment of the present disclosure. As shown in FIG. 10, a line width and a thickness of a wiring in a drive circuit layer of the embodiment of the present invention can affect a proportion of a light transmittance region in the drive circuit layer. Wirings in the drive circuit layer include a first wiring, a second wiring, and a third wiring. Taking a copper wiring as an example, when a width of a wiring is 230 um and a thickness is 5.5 um, a proportion of a light transmittance region in the drive circuit layer is 66%.

In an exemplary embodiment, taking a light-emitting region divided into five light-emitting sub-regions as an example, a light-emitting sub-region of each light-emitting element is divided into concentric rings according to a region design for adjusting and controlling a light transmittance rate of this scheme. Through different designs of line widths of wirings in corresponding five light-emitting sub-regions, proportions of light transmittance regions in the five light-emitting sub-regions is controlled to be 22.3%, 28.6%, 40.0%, 66.7%, and 100%, respectively, so as to control light transmittance rates of the five light-emitting sub-regions and achieve different transmittance-reflection ratios.

The embodiment of the present invention may also reduce a proportion of a light transmittance region in a drive circuit layer by adding a first wiring and a second wiring, so as to realize a design with a small aperture ratio.

In an exemplary embodiment, a wiring in a drive circuit layer of the embodiment of the present invention may be made of Al or Ag, so that light energy on the wiring can be efficiently reflected or completely transmitted without being absorbed or lost. An insulating layer may be formed on the wiring to prevent the wiring from being oxidized. An ITO layer may be used as the insulating layer. For example, the wiring may adopt a multi-layer structure such as ITO/Ag/ITO or ITO/Ag/Al/Ag/ITO, or other transparent materials. Other materials may be used for the wiring in the embodiment of the present invention as long as the wiring cannot absorb light energy.

In an exemplary embodiment, a line width of a wiring in the embodiment of the present invention is less than 100 um, so as to prevent the wiring from affecting a display effect adversely. In the embodiment of the present invention, an existing LED back-light light board is used to test visibility of micro-structure line pairs (simulating a line width of a LED drive circuit) with different period values (that is, a line width w of the line pairs). According to test results, in a case that duty cycles of the micro-structure line pairs are the same (a duty cycle selected by a test is 0.5), when a line width value of the line pairs is less than 100 um, the line pairs are not visible under conditions of a light board and a Quantum Dots (QD) film, that is, uniformity of back-light is not affected.

In an exemplary embodiment, the substrate 1 is made of a transparent material, and light emitted by the light-emitting element 3 is emitted through the substrate 1. For example, the substrate 1 may be a PCB substrate or a transparent substrate such as glass, and a thickness of the transparent substrate may be 0.5 mm. Further, a material of the substrate 1 is a material with a high light transmittance rate, for example, the substrate 1 is a glass substrate, a light transmittance rate of the substrate 1 is 92%, and a refractive index of the substrate 1 n=1.52.

In an exemplary embodiment, a wiring 201 in a drive circuit layer 2 are made of a reflective material, for example, the wiring 201 is made of a metal material such as metal copper and metal silver.

In an exemplary embodiment, a light-emitting element 3 is a Lambertian light source, which may be an LED lamp, for example, the light-emitting element 3 is a Mini-LED lamp, and a size of the light-emitting element 3 is 50-500 um; or, the light-emitting element 3 is a Micro-LED lamp. Light-emitting elements 3 are disposed in an array on a drive circuit layer 2. For example, the light-emitting elements 3 are disposed in a quadrilateral or triangular array on the drive circuit layer 2.

In an exemplary embodiment, an encapsulation layer 4 encapsulates and fixes a light-emitting element 3. A refractive index of a material of the encapsulation layer 4 is not greater than a refractive index of a substrate 1 for ensuring that light transmitted through the encapsulation layer 4 can be emitted from the substrate 1. For example, the encapsulation layer 4 is made of a PCB material with a refractive index n=1.5. A distance from a surface of the encapsulation layer 4 on a side away from the substrate 1 to the substrate 1 is greater than a distance from a surface of the light-emitting element 3 on a side away from the substrate 1 to the substrate 1, and a reflected light path of light can be provided. For example, a thickness of the encapsulation layer 4 is 0.3T. A flatness of a surface of the encapsulation layer 4 on a side away from the light-emitting element 3 is greater than 95%, so that a first reflective layer 5 may be disposed conveniently. An air gap introduced by unevenness of the encapsulation layer 4 will bring about loss of light efficiency. According to the embodiment of the present invention, the gap may be filled by the first reflective layer 5.

In an exemplary embodiment, a surface of a first reflective layer 5 near a light-emitting element 3 is provided with multiple micro-structures, and/or the first reflective layer 5 includes multiple pore structures. In one aspect, the micro-structures and/or the pore structures can scatter small-angle light (0~10 degrees) emitted by the light-emitting element, which concentrates most of energy, and convert it into reflected light of other angles, so as to prevent the small-angle light from reflecting at a small angle again and affecting a uniform distribution effect of energy. In another aspect, the micro-structures and/or the pore structures can diffusely reflect incident light, scatter light with a total reflective angle (41 degrees) in an encapsulation layer, and convert the light with the total reflective angle (41 degrees) into light with a non-total reflective angle to emit from a drive circuit layer, so as to improve a light obtaining ability of the drive circuit layer and improve a light efficiency of back-light.

Figure 11:
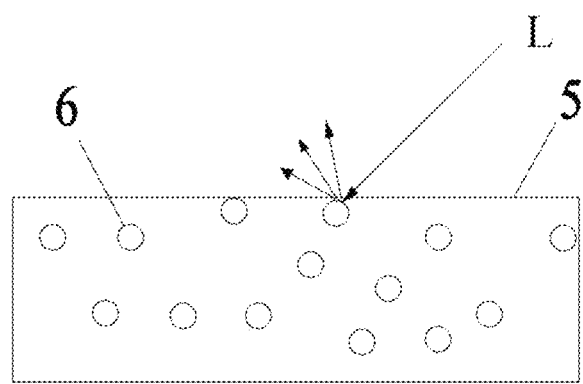
FIG. 11 is a schematic diagram of diffuse reflection of incident light by a first reflective layer in an exemplary embodiment of the present disclosure.

FIG. 11 is a schematic diagram of diffuse reflection of incident light by a first reflective layer in an exemplary embodiment of the present disclosure. As shown in FIG. 11, a first reflective layer 5 includes multiple pore structures 6. The multiple pore structures 6 are constructed in the first reflective layer 5 by adding foaming agent or introducing inert gas during an extrusion process of a resin material of a white reflective film, so as to realize diffuse reflection of incident light L. A reflectivity of the first reflective layer 5 can reach over 98%, and absorption loss is less than 2%.

The embodiment of the present invention adopts a design of micro-structures and/or pore structures, which can obtain light-emitting uniformity of greater than 88% on a light-emitting side of a light-emitting substrate. Compared with a scheme of adopting a simple reflecting surface, for example, obtaining uniformity of greater than 80% in a light-emitting substrate with a thickness of 0.8 mm, a distance for uniform light is reduced, that is, a thickness of the entire structure is reduced. At the same time, an overall light efficiency is increased from 72% to 95%.

The light-emitting substrate of the embodiment of the present invention achieves a uniform light effect with a high uniformity on the light-emitting side, and simultaneously, a light efficiency thereof meets requirements of back-light devices. As for an entire light-emitting substrate, the embodiment of the present invention omits a lower diffusion plate structure of an existing light-emitting substrate, a total thickness of a light-emitting substrate is reduced from 3.85 mm to 1.18 mm, the number of light-emitting elements used is reduced from 100,000 to about 38,000, and a cost of the light-emitting substrate is reduced in multiple dimensions.

In an exemplary embodiment, a distribution of light-emitting elements in the embodiment of the present invention may be quadrilateral or triangular.

Figure 9:
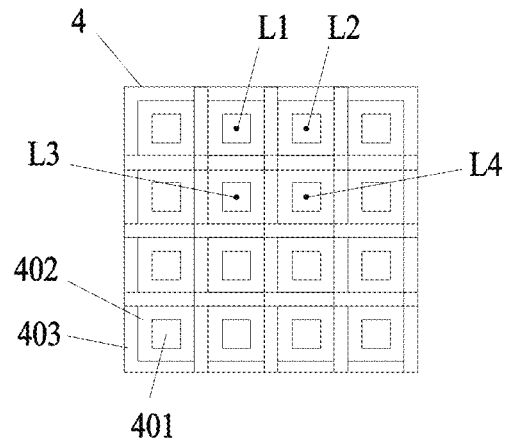
FIG. 9 is a schematic diagram of a distribution of light-emitting elements in an exemplary embodiment of the present disclosure.

FIG. 9 is a schematic diagram of a distribution of light-emitting elements in an exemplary embodiment of the present disclosure. As shown in FIG. 9, in order to reduce a difficulty of wiring, light-emitting elements may be disposed in a rectangular array. A side of a drive circuit layer near a substrate is divided into three sub-regions of a first light-emitting sub-region, a second light-emitting sub-region, and a third light-emitting sub-region; and the light-emitting elements L1 to L4 are disposed in a rectangular arrangement. According to a transmittance-reflection distribution design, the outermost third light-emitting sub-region is an overlapping part of two adjacent light-emitting elements, and a pitch between the light-emitting elements is 4.445 um. A back-light scheme of a 65-inch 4K display requires about 60,000 light-emitting elements, which is less than a conventional demand of 100,000 light-emitting elements, and there is a great optimization in cost.

The present disclosure further provides a light-emitting module including the aforementioned light-emitting substrate and at least one of a Quantum Dots layer, a prism sheet, and a Curtain Tape disposed on a light-emitting side of the light-emitting substrate.

The present disclosure further provides a display module, including the aforementioned light-emitting module.

The present disclosure further provides a preparation method of a light-emitting substrate, including: forming a drive circuit layer on a side of a substrate; forming at least one light-emitting element on a side of the drive circuit layer away from the substrate; forming a first reflective layer on a side of the light-emitting element away from the substrate; wherein the drive circuit layer includes multiple first wirings and second wirings which are disposed crosswise, and the first wirings and the second wirings form at least one light transmittance region.

Although the embodiments disclosed in the present disclosure are as described above, the described contents are only the embodiments for facilitating understanding of the present disclosure, which are not intended to limit the present disclosure. Any person skilled in the art may make any modifications and variations in forms and details of implementations without departing from the spirit and the scope disclosed in the present disclosure, but the patent protection scope of the present application should still be subject to the scope defined by the appended claims.

What is claimed is:

1. A light-emitting substrate, comprising:
a substrate, a drive circuit layer located on a side of the substrate, at least one light-emitting element located on a side of the drive circuit layer away from the substrate, and a first reflective layer disposed on a side of the light-emitting element away from the substrate;
wherein the drive circuit layer comprises a plurality of first wirings and second wirings which are disposed crosswise, and the first wirings and the second wirings form at least one light transmittance region,
wherein the drive circuit layer further comprises a second reflective layer disposed on a side of the first wirings close to the substrate, and a vertical projection of the second reflective layer on the substrate is at least partially overlapped with a vertical projection of the first wirings on the substrate.

2. The light-emitting substrate according to claim 1, wherein the first wirings extend along a first direction, the second wirings extend along a second direction, and the first direction is different from the second direction.

3. The light-emitting substrate according to claim 1, wherein the drive circuit layer further comprises a third reflective layer disposed on a side of the second wirings away from the substrate, and a vertical projection of the third reflective layer on the substrate is at least partially overlapped with a vertical projection of the second wirings on the substrate.

4. The light-emitting substrate according to claim 1, wherein a light-emitting region is provided corresponding to the light-emitting element on a side of the drive circuit layer close to the substrate, and the light-emitting region comprises a first light-emitting sub-region and a second light-emitting sub-region; the first reflective layer reflects at least part of light emitted by the light-emitting element to the first light-emitting sub-region; and the first reflective layer reflects light reflected by the drive circuit layer to the second light-emitting sub-region.

5. The light-emitting substrate according to claim 4, wherein the light-emitting element is in one-to-one correspondence to the light-emitting region.

6. The light-emitting substrate according to claim 4, wherein the second light-emitting sub-region is disposed around the first light-emitting sub-region; the light-emitting region further comprises a third light-emitting sub-region, which is located on a side of the second light-emitting sub-region away from the first light-emitting sub-region and is disposed around the second light-emitting sub-region; and the first reflective layer reflects at least part of light reflected by the drive circuit layer to the third light-emitting sub-region.

7. The light-emitting substrate according to claim 6, wherein at least two light-emitting elements are provided on the light-emitting substrate, and the at least two light-emitting elements comprise first light-emitting element and second light-emitting element adjacent to each other, and the third light-emitting sub-region of the first light-emitting element is at least partially overlapped with the third light-emitting sub-region of the second light-emitting element.

8. The light-emitting substrate according to claim 6, wherein the first light-emitting sub-region is circular, and both the second light-emitting sub-region and the third light-emitting sub-region are annular; or, the first light-emitting sub-region is rectangular, and both the second light-emitting sub-region and the third light-emitting sub-region are rectangular rings.

9. The light-emitting substrate according to claim 8, wherein the first light-emitting sub-region is circular, and both the second light-emitting sub-region and the third light-emitting sub-region are annular; radii $R_n$ of the first light-emitting sub-region, the second light-emitting sub-region, and the third light-emitting sub-region satisfies the following formula:

$$R_n = 0.5l + (2n-1)t \times \tan\theta$$

wherein t is a distance between the drive circuit layer and the first reflective layer, in mm;
l is a side length of the light-emitting element, in mm;
n is a partition level of a light-emitting sub-region of a side of the drive circuit layer close to the substrate;
and θ is a total reflective angle of light on a side of the drive circuit layer away from the substrate.

10. The light-emitting substrate according to claim 7, wherein a distance L between adjacent light-emitting elements satisfies the following formula:

$$L = l + 2 \times 2(N-1)t \times \tan\theta$$

wherein t is a distance between the drive circuit layer and the first reflective layer, in mm;
l is a side length of the light-emitting element, in mm;
N is a partition quantity of light-emitting sub-regions of a side of the drive circuit layer close to the substrate;
and θ is a total reflective angle of light on a side of the drive circuit layer away from the substrate.

11. The light-emitting substrate according to claim 1, wherein one side of the drive circuit layer close to the substrate comprises a light-emitting region corresponding to the light-emitting element, the light-emitting region is divided into N light-emitting sub-regions, and the N light-emitting sub-regions at least comprises a first light-emitting sub-region and a second light-emitting sub-region; the first reflective layer reflects light emitted by the light-emitting element to the first light-emitting sub-region; the first reflective layer reflects light reflected by the wirings to the second light-emitting sub-region, and a light transmittance rate $T_n$ of each light-emitting sub-region satisfies the following formula:

$$T_n = 2/2 \times (N-n) + 1$$

wherein N is a partition quantity of light-emitting sub-regions in one side of the drive circuit layer close to the substrate;

and n is a partition level of a light-emitting sub-region of a side of the drive circuit layer close to the substrate.

12. The light-emitting substrate according to claim 1, wherein a line width of the wirings is less than 100 um.

13. The light-emitting substrate according to claim 1, wherein a side of the first reflective layer close to the light-emitting element is provided with a plurality of microstructures, and/or the first reflective layer comprises a plurality of blowhole structures.

14. The light-emitting substrate according to claim 1, wherein the light-emitting substrate further comprises an encapsulation layer located between the light-emitting element and the first reflective layer, wherein a refractive index of the encapsulation layer is less than or equal to a refractive index of the substrate.

15. The light-emitting substrate according to claim 14, wherein a distance from a surface of the encapsulation layer on a side away from the substrate to the substrate is greater than a distance from a surface of the light-emitting element on a side away from the substrate to the substrate; and/or a flatness of a surface of the encapsulation layer on a side away from the light-emitting element is greater than 95%.

16. The light-emitting substrate according to claim 1, wherein the light-emitting element is a Mini-LED.

17. A light-emitting module, comprising:
the light-emitting substrate according to claim 1.

18. A display module, comprising the light-emitting module of claim 17.

19. A preparation method of a light-emitting substrate, comprising:
forming a drive circuit layer on a side of a substrate;
forming at least one light-emitting element on a side of the drive circuit layer away from the substrate; and
forming a first reflective layer on a side of the light-emitting element away from the substrate,
wherein the drive circuit layer comprises a plurality of first wirings and second wirings which are disposed crosswise, and the first wirings and the second wirings form at least one light transmittance region,
wherein the drive circuit layer further comprises a second reflective layer disposed on a side of the first wirings close to the substrate, and a vertical projection of the second reflective layer on the substrate is at least partially overlapped with a vertical projection of the first wirings on the substrate.

* * * * *